US008937024B2

(12) United States Patent
Bergmann et al.

(10) Patent No.: US 8,937,024 B2
(45) Date of Patent: Jan. 20, 2015

(54) PROCESS AND DEVICE FOR PRODUCING AT LEAST ONE PHOTONIC COMPONENT

(71) Applicants: Ralf Bergmann, Bremen (DE); Mike Bülters, Bremen (DE); Vijay Vittal Parsi Sreenivas, Bremen (DE)

(72) Inventors: Ralf Bergmann, Bremen (DE); Mike Bülters, Bremen (DE); Vijay Vittal Parsi Sreenivas, Bremen (DE)

(73) Assignee: BIAS Bremer Institut für angewandte Strahltechnik GmbH, Bremen (DE)

( * ) Notice: Subject to any disclaimer, the term of this patent is extended or adjusted under 35 U.S.C. 154(b) by 0 days.

(21) Appl. No.: 13/623,509

(22) Filed: Sep. 20, 2012

(65) Prior Publication Data
US 2013/0183775 A1 Jul. 18, 2013

(30) Foreign Application Priority Data
Sep. 21, 2011 (DE) .................. 10 2011 113 824

(51) Int. Cl.
| | |
|---|---|
| H01L 21/263 | (2006.01) |
| G02B 6/13 | (2006.01) |
| H01L 21/66 | (2006.01) |
| B23K 26/00 | (2014.01) |
| H01L 27/146 | (2006.01) |
| G02B 6/138 | (2006.01) |
| G02B 5/18 | (2006.01) |
| G02B 6/122 | (2006.01) |

(52) U.S. Cl.
CPC ............ H01L 22/12 (2013.01); B23K 26/0042 (2013.01); H01L 27/14601 (2013.01); B23K 26/0048 (2013.01); B23K 26/006 (2013.01); G02B 6/138 (2013.01); G02B 5/1857 (2013.01); B23K 26/0057 (2013.01); B23K 2201/40 (2013.01); G02B 6/1225 (2013.01)
USPC ................ 438/799; 438/96; 438/97; 385/14; 385/129

(58) Field of Classification Search
None
See application file for complete search history.

(56) References Cited

U.S. PATENT DOCUMENTS

| | | | |
|---|---|---|---|
| 2004/0081033 A1* | 4/2004 | Arieli et al. ..................... 369/18 |
| 2008/0251812 A1 | 10/2008 | Yoo | |
| 2009/0087132 A1* | 4/2009 | Sigalas et al. .................... 385/2 |
| 2011/0211249 A1 | 9/2011 | Quick et al. | |

FOREIGN PATENT DOCUMENTS

| | | | |
|---|---|---|---|
| DE | 10 2009 007 769 A1 | 8/2010 | |
| JP | 2003-121667 | * 4/2003 | .............. G02B 6/12 |

OTHER PUBLICATIONS

Wortmann, D. [et al.], Micro- and nanostructures inside sapphire by fs-laser irradiation and selective etching, Opt. Express 16, 1517-1522 (2008).

* cited by examiner

*Primary Examiner* — Zandra Smith
*Assistant Examiner* — Pamela E Perkins
(74) *Attorney, Agent, or Firm* — McGlew and Tuttle, P.C.

(57) ABSTRACT

A process for producing at least one photonic component (32, 33, 35, 39, 41), includes inserting the photonic component (32, 33, 35, 39, 41) into a surface layer (12) of a semiconductor wafer and/or within a semiconductor wafer, especially of a semiconductor chip (11, 31, 34, 38, 40) for the simpler and more cost-effective production with the most desired possible three-dimensional structures. At least one laser beam (22) is coupled into the material of the surface layer (12) and/or of the semiconductor wafer, in which the laser beam (22) is focused at a predetermined depth in the material. At least one property of the material and/or the material structure is changed in the area of focus (23, 36).

14 Claims, 3 Drawing Sheets

PROCESS AND DEVICE FOR PRODUCING AT LEAST ONE PHOTONIC COMPONENT

CROSS REFERENCE TO RELATED APPLICATIONS

This application claims the benefit of priority under 35 U.S.C. §119 of German Patent Application DE 10 2011 113 824.6 filed Sep. 21, 2011, the entire contents of which are incorporated herein by reference.

FIELD OF THE INVENTION

The present invention pertains to a process for producing at least one photonic component in a surface layer of a semiconductor wafer or semiconductor chip and/or within the semiconductor wafer or semiconductor chip, in which at least one laser beam is coupled into the material of the surface layer and/or semiconductor wafer or semiconductor chip, in which the laser beam is focused at a predetermined depth in the material, and in which at least one property of the material and/or the material structure in the area of focus is changed. Furthermore, the present invention pertains to a device for producing at least one photonic component according to the process according to the present invention in the surface layer of a semiconductor wafer or semiconductor chip, and with a displaceable positioning means for focusing the laser beam at a predetermined site.

BACKGROUND OF THE INVENTION

Such a process and such a device are known from U.S. 2011/0211249 A1.

Further, it is known to combine photonic components with semiconductor chips by, for example, bonding a semiconductor wafer with photonic components and/or systems to semiconductor chips by means of the so-called flip-chip technique. In the flip-chip technique, the semiconductor chip is mounted onto a circuit substrate directly and without further connecting wires with a contacting side of the semiconductor chip. As a result of this, the semiconductor chip is fastened or bonded to the circuit substrate.

It is a drawback here that photonic components and/or systems can be applied to the semiconductor chip only after their production, for example, in a separate semiconductor wafer. As a result of this, additional production steps are necessary, which leads to an increased effort.

It is also a drawback that essentially only planar and/or two-dimensional photonic structures can be produced by means of the prior-art processes. The risk in this case is that photonic components needed in the future cannot be produced either at all or not in the necessary complexity and/or quality.

In addition, because of the constantly increasing requirements on the data rate in integrated circuits, optical or photonic data lines and/or components are of increasing relevance not only between electronic boards and/or between electronic components. Optical and/or photonic components are, on the contrary, also of increasing relevance within semiconductor chips for achieving high data rates, especially at low energy consumption. Besides optical and/or photonic lines, optical and/or photonic circuits and/or routers to the control unit of the data stream, are, for example, also relevant in this case. Optical and/or photonic networks and/or sensors in and/or on semiconductor chips are also of increasing interest.

SUMMARY OF THE INVENTION

Therefore, a basic object of the present invention is to provide a process and a device of the type mentioned in the introduction, such that optical and/or photonic components can be produced in a simpler and more cost-effective manner with the most desired possible three-dimensional structures.

The basic object of the present invention is accomplished by a process of the type mentioned in the introduction, in which the photonic component is inserted into the material below and/or above a circuit layer, whereby an image recognition means is used for recognizing circuits. Furthermore, the basic object of the present invention is accomplished by a device of the type mentioned in the introduction, in which an image recognition means is provided for recognizing circuits.

It is advantageous in this case that complex two-dimensional and/or three-dimensional structures can be produced as optical and/or photonic components, networks and/or sensors, e.g., in semiconductor wafers, semifinished and/or finished semiconductor chips. The material outside the focus preferably remains unchanged here. Photonic components can especially be produced in the surface layer of a semiconductor wafer and/or semiconductor chip. Such a surface layer may be formed from a non-semiconductive material, especially a polymer. Photonic components can preferably be produced within, especially under a surface layer of the semiconductor wafer and/or the semiconductor chip. Previously unused material of the semiconductor wafer and/or of the semiconductor chip can be used in this case for the production of the photonic component. High packing densities, a high number of interconnection possibilities and/or new functionalities can thus be achieved. The advantages of optical data processing can thus already be used in the area of a semiconductor chip.

It is also advantageous that common problems encountered in closely adjacent data lines because of their effect on one another, especially because of so-called crosstalk, because of three-dimensional structurability and/or the use of optical and/or photonic components can be avoided.

A plurality of laser beams, especially eight, ten or twelve laser beams, are preferably inserted at the same time. The laser beams can be focused at the same time in a plurality of areas deviating from one another, especially corresponding to the number of laser beams. As a result of this, a higher production rate and/or production speed can be achieved. For providing the plurality of laser beams, a plurality of lasers corresponding to the number of laser beams can be provided, and/or at least one beam splitter is provided, with which a single laser beam is split into a plurality of laser beams.

According to another embodiment, the laser beam is then focused in the material for producing the photonic component of a predetermined structure. Individual points of the predetermined structure for focusing the laser beam can be separately started or activated here, and/or the structure can be continuously started with a focused laser beam. The structure especially has a two-dimensional and/or three-dimensional design. It is advantageous in this case that complex three-dimensional structures can be produced.

According to one variant, the photonic component is inserted into the material under and/or above a circuit layer, especially a completely or partly produced integrated circuit. Here, the semiconductor wafer may have a surface layer, a circuit layer and a material layer, whereby preferably the circuit layer is arranged between the surface layer and the material layer. The surface layer is particularly made of non-semiconductive material. For example, the surface layer should be made of a polymer. The surface layer is preferably used as a protective layer for the circuit layer. The material layer is especially arranged on a side of the circuit layer turned away from the surface layer. The material layer is preferably made of semiconductor material, especially silicon. The surface layer or material layer to be treated with the focused laser beam is especially facing the laser and/or focusing means. Especially in a semiconductor chip, the surface layer and/or material layer represent hitherto unused material reserves. These can now be used by photonic components being able to be inserted into the surface layer and/or into the material layer.

The changed properties of the material and/or the changed material structure may depend on the duration of focusing of the laser beam in the area of focus and/or depend on the energy density of the focused laser beam. Thus, desired properties of the material in the area of focus can be produced in a simple and at the same time changeable manner by means of suitable parameters, especially the duration of the focusing and/or the energy density of the laser beam. A multiphoton absorption, and especially a two-photon absorption, is preferably achieved by means of the focusing in the area of focus. Consequently, the material properties can be changed in a spatially limited and/or definable area, as a result of which complex photonic structures can be produced with a sufficient accuracy and/or reproducibility.

At least one optical property, especially the refractive index, of the material is preferably changed in the area of focus. As a result of this, a refractive index jump can be achieved within the material, as a result of which optical and/or photonic components, especially light conductors, can be produced. The refractive index in the area of focus is preferably lower than in the material outside the area of focus. In the surface layer a photonic component may be designed as a free-standing structure. Such photonic components may be made of a polymer. The polymer and thus the photonic component preferably have a refractive index that deviates from the refractive index of the surrounding air. For example, the refractive index of the polymer may be greater than the refractive index of air. Areas of material can especially be changed, such that an untreated region of the material is surrounded by treated material, in which the laser beam has been focused. The region untreated and surrounded by changed material may then, for example, be used as a light conductor. Especially photonic crystals can consequently be produced. The photonic component and/or light conductor may have a tubular and/or tube-shaped design. Deflections and/or changes in direction can be achieved because of a suitable arrangement of areas with a refractive index different from the material.

According to another embodiment, a material hole is produced in the area of focus, and/or the grid structure of the material is changed. The material hole preferably has a tubular and/or tube-shaped shape. Thus, the material hole, light conductor and/or photonic component may extend through the material in a duct-like, tubular and/or tube-shaped manner. By means of predetermined arrangement of holes and/or of a changed grid structure in the material, a predetermined structure of a photonic component can be attained. Holes and/or a changed grid structure in the material can especially be arranged, such that an untreated region of the material is surrounded by the holes and/or changed grid structure. The region which is untreated and surrounded by holes and/or a changed grid structure may then be used, for example, as a light conductor. Consequently, photonic crystals can preferably be produced. As an alternative or in addition, the material structure, especially the grid structure of the semiconductor material, can be achieved because of focusing the laser beam in the area of focus. Crystalline, especially monocrystalline, silicon in the area of focus is preferably changed with regard to its refractive index. There is especially a lower refractive index in the area of focus than in the untreated material. The silicon may be converted into a mixed phase between crystalline and amorphous silicon in the area of focus. Crystalline silicon, and preferably monocrystalline silicon in the area of focus is especially converted into amorphous silicon and/or nanocrystalline silicon.

The material for eliminating from the material outside the focus is preferably weakened in the area of focus. The area treated with the focused laser beam and/or weakened can be removed from the material. Photonic structures can also be attained as a result of this. In particular, the area treated with the focused laser beam and/or weakened for eliminating and removing from the material is exposed to a gaseous and/or liquid fluid. For example, the weakened area for eliminating and/or washing out can be pivoted in a liquid, especially in a developing bath.

The weakening of the material and the elimination of the area treated with the focused laser beam are preferably provided for the surface layer of the semiconductor wafer, especially of the semiconductor chip. According to an embodiment which is also conceivable independently of the present invention, the at least one photonic component can in this case be inserted into the surface layer by means of a structuring, especially three-dimensional, lithography process. This is advantageous when the surface layer is made of a non-semiconductive material, especially a polymer.

According to another embodiment, the laser beam is coupled in the semiconductor wafer, especially in the semiconductor chip, by means of a light-coupling-in means to increase the numerical aperture and/or to reduce reflection losses. A focusing is improved as a result of this. An immersion liquid, especially oil or water, is preferably used as a light-coupling-in means. Furthermore, an antireflection layer may be provided. The antireflection layer especially has a refractive index that lies between a refractive index of the focusing means and a refractive index of the material. The antireflection layer preferably has a predetermined thickness.

A change in depth position of the focused area can be achieved by means of a change in the distance between the laser and/or the focusing means, on the one hand, and the semiconductor wafer and/or semiconductor chip, on the other hand. The change in distance can preferably be achieved by means of a mechanical displacement, especially by means of the positioning means.

According to a variant of the device according to the present invention, a displacing in all directions is made possible by means of a multiaxle displacing means. In particular, the positioning means has such a displacing means. Complex, especially three-dimensional photonic structures can be attained by means of such a positioning means and/or displacing means. Here, the semiconductor wafer, and especially semiconductor chip, is preferably mounted in a movable manner and the laser is mounted in a fixed manner. As an alternative, it is, however, likewise possible to mount the semiconductor wafer, and especially semiconductor chip, in a fixed manner and the laser in a movable manner. A position control means is especially provided for detecting the position of the semiconductor wafer, especially the semiconductor chip, material and/or laser. Photonic components and/or structures can consequently be produced with the necessary precision. The position control means is preferably designed as a laser interferometry system or a piezo system.

According to another embodiment, an image recognition means, especially for recognizing circuits, chip structures and/or CMOS structures, is provided. Consequently, it is possible to insert photonic components and/or structures into the material at predetermined positions depending upon already present chip and/or CMOS structures of a semiconductor chip. As a result of this, optical and/or photonic functionalities can especially be inserted in a semifinished or finished semiconductor chip. Damage to already present structures by means of the image recognition means can be avoided here. The image recognition means preferably has a camera.

The image recognition means, position control means, positioning means, focusing means, and/or laser can preferably be controlled by means of a control unit. Individual and/or all functionalities of the device can especially be centrally controlled by means of the control unit.

The shape of the focus and/or area treated with the focused laser beam can preferably be changed by means of the control unit and/or focusing means. The focus and/or the area treated with the focused laser beam is also called volume pixel or voxel. Previously, an ellipsoid shape of the volume pixel is common. The device, control unit and/or focusing means are/is especially designed to attain an ellipsoid, spherical, parallelepiped or rectangular shape of the focus and/or of the area treated with the focused laser beam.

Especially photonic components and/or functionalities according to the following inconclusive list can be attained:

Waveguides, especially polarization-maintaining waveguides, ring resonators, and especially three-dimensional and/or multistage ring resonators, waveguide switches, waveguide splitters, waveguide combiners, waveguide crossings, Fabry-Perot resonators, couplers, circulators, multiplexers, demultiplexers, electric and/or optical modulators, especially with regard to an amplitude, phase and/or polarization, mirrors, Bragg structures, diffraction grids, fiber-chip couplings, light-beam shaping, especially with regard to the beam cross section, electric sensors, optical sensors, chemical sensors, routers.

The electric, optical and/or chemical sensors are especially designed for determining corresponding electric, optical and/or chemical variables.

Electric and/or optical signals can preferably be generated by one or more photonic component.

A semiconductor wafer and/or semiconductor chip is especially advantageously produced according to the process according to the present invention and/or using the device according to the present invention, whereby especially one or more of the components and/or the functionalities mentioned above is attained.

The present invention is described in detail below on the basis of the figures. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
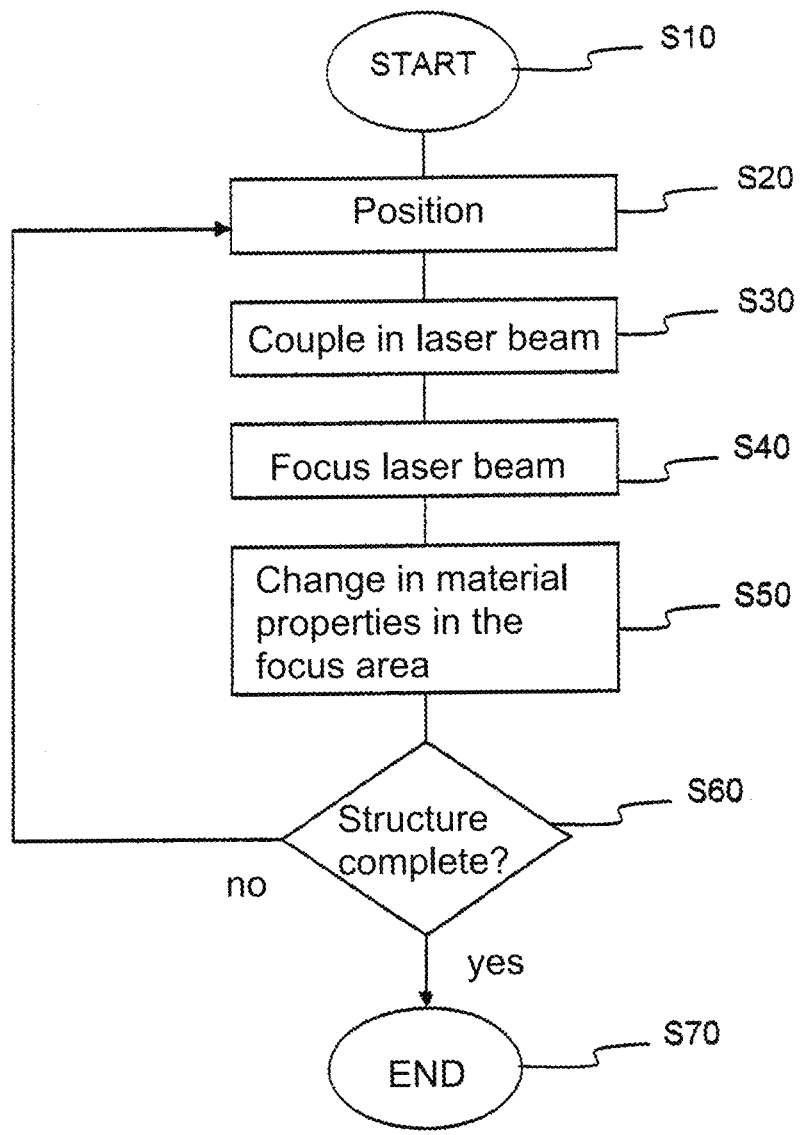
FIG. 1 is a schematic flow chart of a process according to the present invention.

Referring to the drawings in particular, FIG. 1 shows a schematic flow chart of a process according to the present invention for producing a photonic component in a surface layer of a semiconductor wafer and/or within the semiconductor wafer. A semifinished or finished semiconductor chip may be provided instead of a semiconductor wafer.

After the process is started in a step S10, positioning by means of a positioning means is carried out in a step S20. Herein the semiconductor chip and/or laser are/is displaced such that a laser beam can be focused in a predetermined area. A slope correction can be carried out. A position control means may be provided for determining the position of the semiconductor wafer. After the positioning has been carried out, a laser beam is coupled into the material of the surface layer of the semiconductor wafer and/or in the semiconductor wafer itself according to step S30. As long as the laser beam is unfocused, the material is not changed. Then, in step S40, the laser beam is focused by means of a focusing means at a predetermined depth in the material. Because of the focusing, a multiphoton or two-photon absorption is achieved in the area of focus. This leads to a change in at least one material property in the area of focus according to step S50.

Subsequently, in step S60 it is checked whether all areas of a predetermined structure in the material have been treated with the focused laser beam. If this is not the case, a new positioning is performed according to step S20 to complete the predetermined structure. After this, steps S30 through S60 are run through again. If it is determined in step S60 that all areas of the predetermined structure have been treated with the focused laser beam, the process is ended in a step S70.

Figure 2:
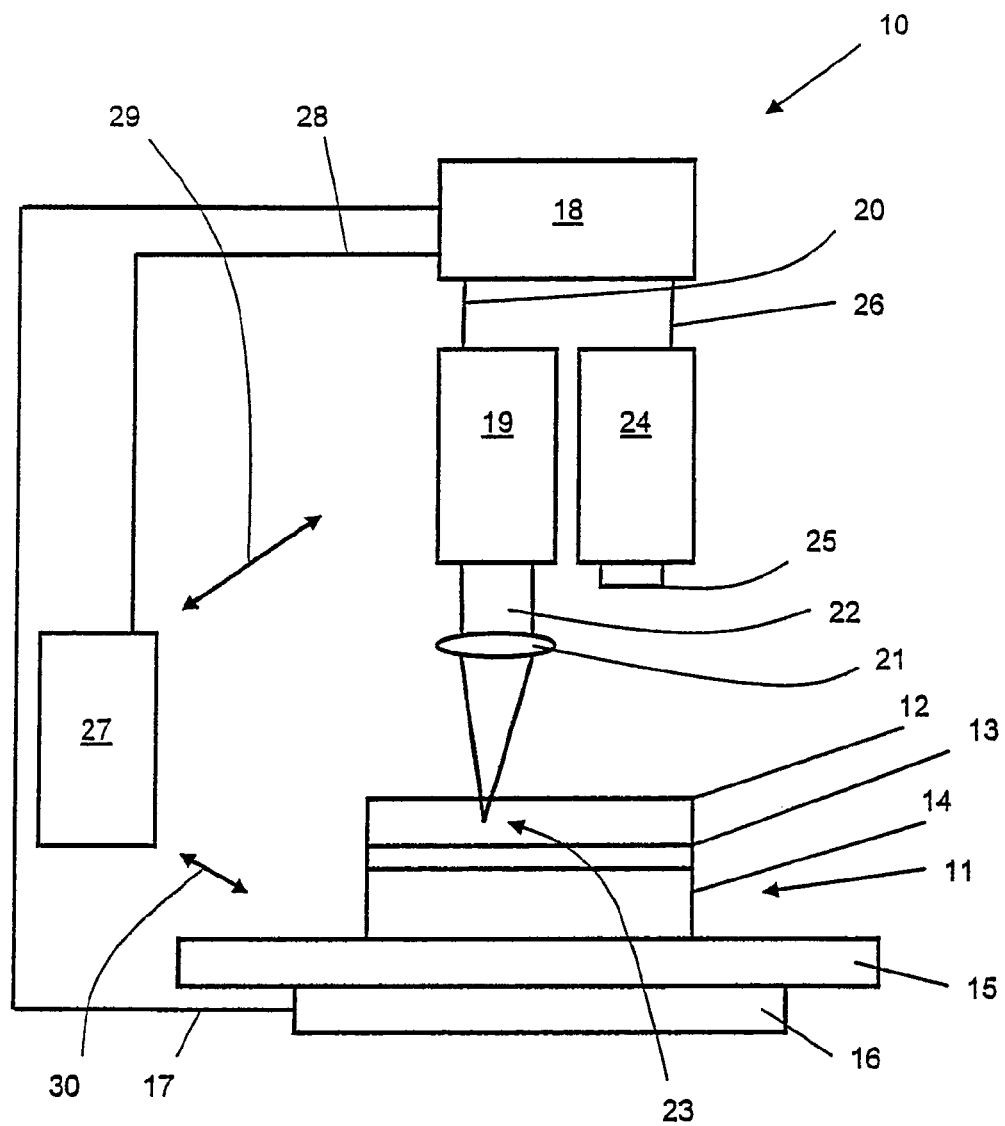
FIG. 2 is a schematic lateral view of a device according to the present invention.

FIG. 2 shows a schematic lateral view of a device 10 according to the present invention. The device 10 is provided for producing photonic components, which are not shown in detail here, in a semiconductor chip 11. The semiconductor chip 11 has a surface layer 12. The surface layer 12 consists of a polymer in the exemplary embodiment shown in FIG. 2. Furthermore, the semiconductor chip 11 has a circuit layer 13 that is arranged under the surface layer 12. Integrated circuits, which are not shown in detail here, are arranged in the circuit layer 13. A material layer 14 is arranged under the circuit layer 13. Circuit layer 13 and material layer 14 contain silicon in the exemplary embodiment shown in FIG. 2.

In the exemplary embodiment shown here, the semiconductor chip 11 is designed as a CMOS (CMOS: Complementary Metal Oxide Semiconductor—German: komplementärer Metall-Oxid-Halbleiter).

The semiconductor chip 11 is fastened to a table 15 and held fixed in relation to the table 15. A positioning means 16 is assigned to the table 15. The table 15 and thus the semiconductor chip 11 can be displaced and positioned by means of the positioning means 16 in all directions in space. In the exemplary embodiment shown here, the table 15 is designed as a so-called multiaxle table. The positioning means 16 is connected to a control unit 18 by means of a line 17.

The device 10 also has a laser 19. The laser 19 is connected to the control unit 18 by means of a line 20. Furthermore, is a focusing means 21 is assigned to laser 19 for focusing a laser beam 22. The laser beam 22 is focused in a focus 23 in the surface layer 12 in the exemplary embodiment shown. As an alternative to this, the laser beam 22 may also be focused in a focus 23 in the material layer 14. For this purpose, compared to the view according to FIG. 2, the semiconductor chip 11 is preferably arranged on the table 15 rotated 180° about its—in this case horizontal—longitudinal axis. In particular, the surface layer 12 or material layer 14 to be treated with the focused laser beam 22 is facing the laser 19 and/or focusing means 21. This makes possible a processing of the surface layer 12 and/or material layer 14, whereby the risk of damage to the circuit layer 13 is markedly reduced or prevented. As an alternative, it is also conceivable for a focus 23 to be focused in material layer 14, whereby the laser beam 22 runs through the circuit layer 13. In the area of the circuit layer 13, the laser beam 22 is unfocused, as a result of which damage to the circuit layer 13 can be avoided. The laser beam 22 may also be inserted laterally into the surface layer 12 and/or material layer 14.

The device 10 has an image recognition means 24 with a lens 25. The image recognition means 24 is connected to the control unit 18 by means of a line 26. As an alternative to the embodiment being shown here, the focusing means 21 and image recognition means 24 may have a single, common lens. In this case, a beam splitter is especially provided.

Moreover, a position control means 27 is provided. The position control means 27 is connected to the control unit 18 by means of a line 28. As indicated by the arrows 29, 30, the position control means 27 is designed for detecting the position of the table 15 or the semiconductor chip 11 and/or the laser 19.

Figure 3:
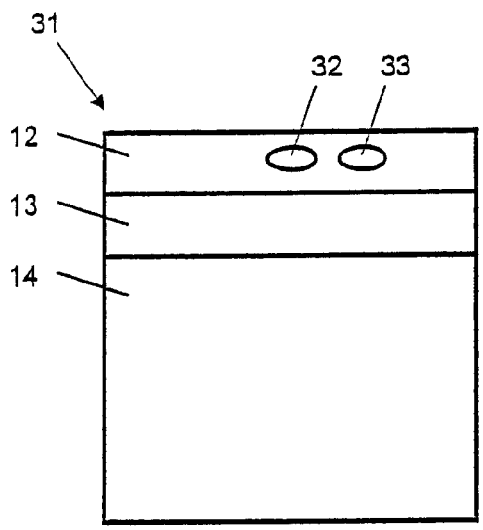
FIG. 3 is a cutaway schematic lateral view of a first semiconductor chip with photonic components.

FIG. 3 shows a cutaway schematic lateral view of a first semiconductor chip 31 with photonic components 32, 33. The structure of semiconductor chip 31 corresponds to that of semiconductor chip 11 according to FIG. 2. Identical features as above have correspondingly identical reference numbers. In this respect, reference is also made to the above description. Photonic components 32, 33 are inserted into the surface layer 12 of the semiconductor chip 31 in the exemplary embodiment shown in FIG. 3. As an alternative to this, the photonic components 32, 33 may also be designed as free-standing components without being embedded into a surface layer 12 surrounding same.

Figure 4:
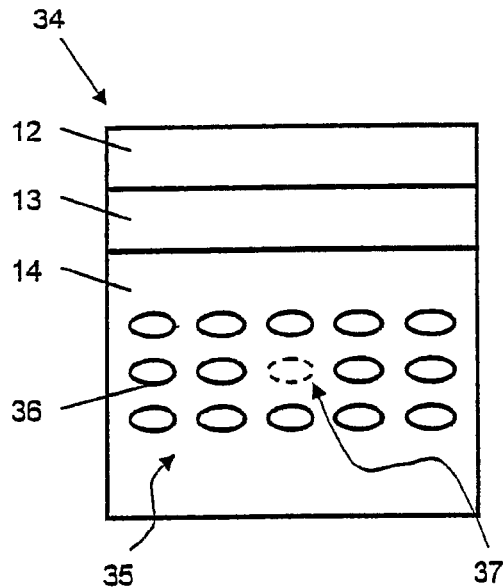
FIG. 4 is a cutaway schematic lateral view of a second semiconductor chip with a photonic component.

FIG. 4 shows a cutaway schematic lateral view of a second semiconductor chip 34 with photonic component 35. The structure of the semiconductor chip 34 corresponds to that of the semiconductor chip 11 according to FIG. 2. Identical features as above have correspondingly identical reference numbers. In this respect, reference is also made to the above description. Photonic component 35 is inserted into material layer 14 in the exemplary embodiment shown in FIG. 4. Photonic component 35 is designed in this case as a photonic crystal. This photonic crystal has periodically arranged holes 3, which, in the exemplary embodiment shown here, run through material layer 14 in a tubular and/or tube-shaped manner. For the sake of better clarity, not all tubular holes 36 or tubes 36 are provided with a reference number. As an alternative, the holes or tubes 36 may also be arranged aperiodically. The tubes 36 surround a light-conducting area 37 shown in dotted line. The tubular light-conducting area 37 makes possible a predetermined conduction of light in the material layer 14. As an alternative to the embodiment shown here, more rows of holes or tubes 36 may be provided.

Figure 5:
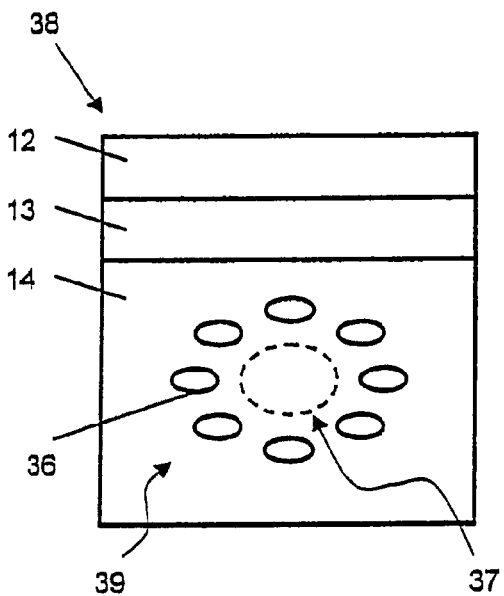
FIG. 5 is a cutaway schematic lateral view of a third semiconductor chip with a photonic component.

FIG. 5 shows a cutaway schematic lateral view of a third semiconductor chip 38 with a photonic component 39. The structure of the semiconductor chip 38 corresponds to that of the semiconductor chip 11 according to FIG. 2. Identical features as above have identical reference numbers. In this respect, reference is also made to the above description. In the exemplary embodiment shown here, the photonic component 39 is arranged within the material layer 14, similar to the one according to FIG. 4. Unlike the example according to FIG. 4, the tubular holes 36 extending in the material layer 14 in this case are arranged in a circular manner about the light-conducting area 37. According to an alternative design, no holes are provided, but rather properties of the material of material layer 14 are changed in areas 36 based on the focusing of the laser beam 22. In the exemplary embodiment shown here, the refractive index of the material in the areas 36 is lower than in the material layer 14 outside the areas 36, as a result of which a refractive index jump is achieved. As an alternative to the embodiment shown here, a plurality of rings arranged concentric to the light-conducting area 37 are provided with holes having a tubular design or tubes 36. The holes 36 may also together form a perforated jacket which is not shown in detail in this case and which surrounds the light-conducting area 37 in a tubular manner.

Figure 6:
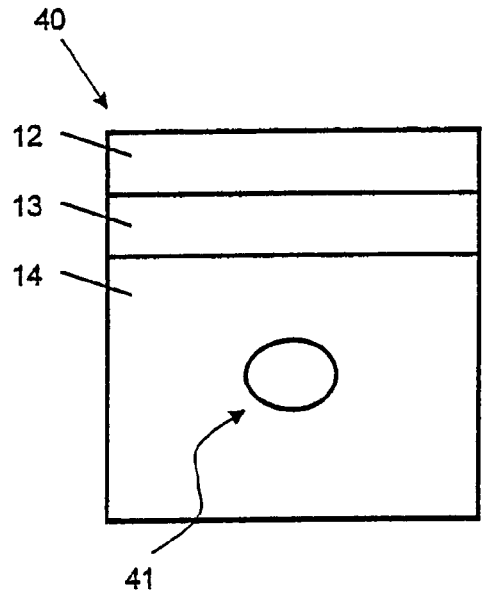
FIG. 6 is a cutaway schematic lateral view of another semiconductor chip with a photonic component.

FIG. 6 shows a cutaway schematic lateral view of another semiconductor chip 40 with a photonic component 41. The structure of the semiconductor chip 40 corresponds to that of the semiconductor chip 11 according to FIG. 2. Identical features as above have correspondingly identical reference numbers. In this respect, reference is also made to the above description. The photonic component (the modified material area) 41 is likewise arranged in the material layer 14 in the exemplary embodiment shown in FIG. 6. Because of the focusing of the laser beam 22 with a predetermined energy density in the area of the photonic component (the modified material area) 41 for a predetermined duration, the material in this area is modified by the refractive index in the modified material area (the photonic component) 41 deviating from the refractive index of material layer 14, as a result of which the area 41 can be utilized as a photonic component 41. In the exemplary embodiment shown here, photonic component 41 is embedded into the material layer 14 in a tubular or duct-like manner. Material layer 14 in this case consists of crystalline silicon, and photonic component 41 consists of amorphous or nanocrystalline silicon. Further, the refractive index in the area of the photonic component 41 is higher than in the surrounding material layer 14.

Thus, two- and/or three-dimensional photonic components 32, 33, 35, 39, 41 in a semiconductor chip 11, 31, 34, 38, 40 can be produced by means of the process according to the present invention according to FIG. 1 and the device 10 according to the present invention according to FIG. 2.

It is advantageous in this case that previously unused material areas of prior-art semiconductor chips, such as the surface layer 12 and/or material layer 14 can be used for the photonic components 32, 33, 35, 39, 41. A plurality of photonic components 32, 33, 35, 39, 41 may be provided in this case for embodying a photonic network and/or photonic sensor and are connected to one another. Because of the use of optical and/or photonic components, high data rates with simultaneously low energy consumption can be achieved.

While specific embodiments of the invention have been shown and described in detail to illustrate the application of the principles of the invention, it will be understood that the invention may be embodied otherwise without departing from such principles.

| List of Reference Numbers: | |
|---|---|
| 10 | Device |
| 11 | Semiconductor chip |
| 12 | Surface layer |

-continued

List of Reference Numbers:

| | |
|---|---|
| 13 | Circuit layer |
| 14 | Material layer |
| 15 | Table |
| 16 | Positioning means |
| 17 | Line |
| 18 | Control unit |
| 19 | Laser |
| 20 | Line |
| 21 | Focusing means |
| 22 | Laser beam |
| 23 | Focus |
| 24 | Image recognition means |
| 25 | Lens |
| 26 | Line |
| 27 | Position control means |
| 28 | Line |
| 29 | Arrow |
| 30 | Arrow |
| 31 | Semiconductor chip |
| 32 | Photonic component |
| 33 | Photonic component |
| 34 | Semiconductor chip |
| 35 | Photonic component |
| 36 | Hole or tube |
| 37 | Light-conducting area |
| 38 | Semiconductor chip |
| 39 | Photonic component |
| 40 | Semiconductor chip |
| 41 | Photonic component |
| S10 | Start |
| S20 | Position |
| S30 | Couple in laser beam |
| S40 | Focus laser beam |
| S50 | Changes in material properties in the focus area |
| S60 | Structure complete? |
| S70 | End |

What is claimed is:

1. A process for producing at least one photonic component in a surface layer of a semiconductor wafer or semiconductor chip and/or within the semiconductor wafer or semiconductor chip, the process comprising the steps of:
   coupling at least one laser beam into material of the surface layer and/or material layer of the semiconductor wafer or the semiconductor chip;
   focusing the laser beam at a predetermined depth in the material;
   changing at least one property of the material and/or a material structure of the material in an area of the focus, wherein in the area of focus a material hole is produced and/or a grid structure of the material is changed and crystalline silicon or monocrystalline silicon in the area of focus is converted into amorphous silicon and/or into a mixed phase between crystalline and amorphous silicon;
   inserting a photonic component into the material below and/or above a circuit layer of the semiconductor wafer or semiconductor chip, said circuit layer comprising one of a completely produced integrated circuit and a partially produced integrated circuit; and
   using an image recognition means for recognizing circuits of the circuit layer.

2. A process in accordance with claim 1, wherein the laser beam is subsequently focused in the material for producing a photonic component having a predetermined two-dimensional and/or three-dimensional, structure.

3. A process in accordance with claim 1, wherein the semiconductor wafer has the surface layer, the circuit layer and the material layer, wherein the circuit layer is arranged between the surface layer and the material layer.

4. A process in accordance with claim 1, wherein the changed property of the material and/or the changed material structure in the area of focus depends upon a duration of the focusing of the laser beam and/or on an energy density of the focused laser beam, whereby a two-photon absorption or a multiphoton absorption is achieved by means of the focusing in the area of focus.

5. A process in accordance with claim 1, wherein at least one optical property of the material is changed in the area of focus.

6. A process in accordance with claim 1, wherein said laser beam is focused such that the material in the area of focus is weakened for eliminating the material, at least a portion of said material being removed in said area of focus to form a space in said material, wherein said photonic component is arranged in said space.

7. A process in accordance with claim 1, wherein a refractive index of the material is changed in the area of focus, whereby the refractive index of the material in the area of focus is lower than the refractive index of material outside the area of focus.

8. A process in accordance with claim 1, wherein said laser beam is focused such that the material in the area of focus is weakened and the area treated with the focused laser beam is exposed to a gaseous and/or liquid fluid for eliminating and removal from the material.

9. A semiconductor wafer or semiconductor chip produced according to the process comprising the steps of:
   providing a device comprising a laser for producing at least one laser beam, a focusing means for focusing the laser beam at a predetermined depth in material of the surface layer and/or of the semiconductor wafer or of the semiconductor chip, a displaceable positioning means for applying the laser beam at a predetermined site to form an area of focus and an image recognition means is provided for recognizing circuits;
   coupling at least one laser beam into material of the surface layer and/or material layer of the semiconductor wafer or the semiconductor chip;
   focusing the laser beam at a predetermined depth in the material, wherein in the area of focus a material hole is produced and/or a grid structure of the material is changed and crystalline silicon or monocrystalline silicon in the area of focus is converted into amorphous silicon and/or into a mixed phase between crystalline and amorphous silicon;
   changing at least one property of the material and/or a material structure of the material in an area of the focus;
   inserting a photonic component into the material below and/or above a circuit layer of the semiconductor wafer or semiconductor chip, said circuit layer comprising an integrated circuit; and
   using an image recognition means for recognizing circuits of the circuit layer.

10. A semiconductor wafer or semiconductor chip according to claim 9, whereby one or more of the following photonic components and/or functionalities is embodied: a waveguide; a ring resonator; a waveguide switch; a waveguide splitter; a waveguide combiner; a waveguide crossing; a Fabry-Perot resonator; a coupler; a circulator; a multiplexer; a demultiplexer; an electric and/or optical modulator a mirror; a Bragg structure; a diffraction grid; a fiber-chip coupling; a light-beam shaping device; an electric sensor; an optical sensor; a chemical sensor; and a router.

11. A semiconductor wafer or semiconductor chip according to claim 9, wherein the waveguide is a polarization-maintaining waveguide, the ring resonator is a three-dimensional and/or multistage ring resonator, the electric and/or optical modulator is an amplitude, phase and/or polarization modulator and the light-beam shaping device shapes a beam cross section.

12. A semiconductor wafer or semiconductor chip according to claim 9, wherein at least a portion of said material of said surface layer and/or material layer is removed in said area of focus to define a photonic component receiving area, said photonic component being arranged in said photonic component receiving area.

13. A semiconductor wafer or semiconductor chip according to claim 9, wherein in the area of focus a material hole is produced and/or a grid structure of the material is changed.

14. A process comprising the steps of:
   providing a semiconductor structure comprising a circuit layer and at least one of a surface layer and a material layer, said circuit layer comprising one or more circuits;
   providing a device comprising a laser for producing at least one laser beam;
   providing a focusing means for focusing the laser beam at a predetermined depth in material of said at least one of said surface layer and said material layer;
   providing a displaceable positioning means for applying the laser beam at a predetermined site to form an area of focus;
   providing an image recognition means for recognizing circuits;
   coupling at least one laser beam into the material of said at least one of said surface layer and said material layer;
   focusing the laser beam at a predetermined depth in the material of said at least one of said surface layer and said material layer, wherein one or more of a material hole is produced in the area of focus and a grid structure of the material is changed in the area of focus and crystalline silicon or monocrystalline silicon in the area of focus is converted into one or more of amorphous silicon and a mixed phase between crystalline silicon and amorphous silicon;
   removing said material of said at least one of said surface layer and said material layer in an area of the focus to define a photonic component receiving area;
   inserting a photonic element in said photonic component receiving area, wherein said photonic element is located one of below said circuit layer and above said circuit layer; and
   identifying said one or more circuits of said circuit layer via said image recognition means.

\* \* \* \* \*